(12) United States Patent
Dhau et al.

(10) Patent No.: US 7,989,029 B1
(45) Date of Patent: Aug. 2, 2011

(54) REDUCED POROSITY COPPER DEPOSITION

(75) Inventors: Jaspreet Singh Dhau, Menlo Park, CA (US); Sunity K. Sharma, Fremont, CA (US)

(73) Assignee: SRI International, Menlo Park, CA (US)

( * ) Notice: Subject to any disclaimer, the term of this patent is extended or adjusted under 35 U.S.C. 154(b) by 495 days.

(21) Appl. No.: 12/143,737

(22) Filed: Jun. 20, 2008

Related U.S. Application Data (60) Provisional application No. 60/945,512, filed on Jun. 21, 2007.

(51) Int. Cl.
*B05D 3/12* (2006.01)
*B05D 5/12* (2006.01)

(52) U.S. Cl. ........ 427/337; 257/E29.006; 257/325; 427/58; 427/98.1; 427/98.4; 427/99.5; 427/229; 427/304; 427/305; 427/306; 427/314; 427/430.1; 427/457; 427/556; 427/560; 427/581; 428/209; 428/411.1

(58) Field of Classification Search .......... 427/337
See application file for complete search history.

(56) References Cited

U.S. PATENT DOCUMENTS

| | | | |
|---|---|---|---|
| 3,793,072 A | 2/1974 | Lando | |
| 3,930,963 A | 1/1976 | Polichette et al. | |
| 3,937,857 A | 2/1976 | Brummett et al. | |
| 3,969,554 A | 7/1976 | Zeblisky | |
| 4,486,466 A | 12/1984 | Leech et al. | |
| 4,715,935 A | 12/1987 | Lovie et al. | |
| 4,873,123 A | 10/1989 | Canestaro et al. | |
| 4,976,990 A | 12/1990 | Bach et al. | |
| 5,021,398 A | 6/1991 | Sharma et al. | |
| 5,179,060 A | 1/1993 | Subramanian et al. | |
| 5,281,447 A | 1/1994 | Brady et al. | |
| 5,464,692 A | 11/1995 | Huber | |
| 5,478,462 A | 12/1995 | Walsh | |
| 5,721,007 A | 2/1998 | Lynch et al. | |
| 5,846,615 A | 12/1998 | Sharma et al. | |
| 5,894,038 A | 4/1999 | Sharma et al. | |
| 5,980,998 A | 11/1999 | Sharma et al. | |
| 6,165,912 A | 12/2000 | McConnell et al. | |
| 6,174,353 B1 * | 1/2001 | Yuan et al. | 106/1.11 |
| 6,265,086 B1 | 7/2001 | Harkness | |
| 6,395,332 B1 | 5/2002 | Hanawa et al. | |
| 6,548,122 B1 | 4/2003 | Sharma et al. | |
| 6,663,915 B2 | 12/2003 | Palmans et al. | |
| 6,775,907 B1 | 8/2004 | Boyko et al. | |

(Continued)

FOREIGN PATENT DOCUMENTS

GB    1154152    6/1969

(Continued)

OTHER PUBLICATIONS

U.S. Appl. No. 11/520,341, filed Sep. 12, 2006.

(Continued)

*Primary Examiner* — Michael Kornakov
*Assistant Examiner* — Alexander Weddle
(74) *Attorney, Agent, or Firm* — Beyer Law Group LLP (57) ABSTRACT

A method for reducing porosity of metal layers on a substrate may comprise depositing a precursor onto at least a portion of the substrate, and adding metal layers over the precursor comprising at least one cycle, wherein each cycle comprises: depositing a metal layer over the precursor, and exposing the metal layer to a breath-out solution.

21 Claims, 4 Drawing Sheets

U.S. PATENT DOCUMENTS

| | | | |
|---|---|---|---|
| 6,824,666 | B2 | 11/2004 | Gandikota et al. |
| 6,855,378 | B1 | 2/2005 | Narang |
| 6,911,385 | B1 | 6/2005 | Haubrich et al. |
| 6,972,078 | B1 | 12/2005 | Tsou et al. |
| 2002/0182308 | A1* | 12/2002 | Lee et al. ............... 427/98 |
| 2005/0176990 | A1* | 8/2005 | Coleman et al. ............ 562/11 |
| 2005/0238812 | A1 | 10/2005 | Bhangale et al. |

FOREIGN PATENT DOCUMENTS

| | | |
|---|---|---|
| WO | WO96/27691 | 9/1996 |

OTHER PUBLICATIONS

U.S. Appl. No. 11/854,271, filed Sep. 12, 2007.
Office Action dated Sep. 9, 2010 from U.S. Appl. No. 11/854,277.
Office Action dated Aug. 6, 2010 from U.S. Appl. No. 11/854,271.
Office Action dated Sep. 10, 2010 from U.S. Appl. No. 11/854,274.
Office Action dated Nov. 10, 2010 from U.S. Appl. No. 12/779,867.
Office Action dated Aug. 6, 2010 from U.S. Appl. No. 12/142,577.
U.S. Appl. No. 12/142,577, filed Jun. 19, 2008.
Office Action dated Dec. 1, 2009 from U.S. Appl. No. 12/142,577.
Final Office Action dated Apr. 7, 2010 from U.S. Appl. No. 12/142,577.
Office Action dated Dec. 14, 2009 from U.S. Appl. No. 11/854,277.
Final Office Action dated May 18, 2010 from U.S. Appl. No. 11/854,277.
Office Action dated Jun. 19, 2009 from U.S. Appl. No. 11/854,274.
Final Office Action dated Jan. 7, 2010 from U.S. Appl. No. 11/854,274.

* cited by examiner

REDUCED POROSITY COPPER DEPOSITION

CROSS REFERENCE TO RELATED APPLICATIONS

This application claims priority to U.S. Provisional Application No. 60/945,512 filed on Jun. 21, 2007, entitled "REDUCED POROSITY COPPER DEPOSITION", which is incorporated herein by reference in its entirety and for all purposes.

FIELD OF THE INVENTION

The present disclosure relates generally to the deposition of metal materials. More particularly, the present disclosure relates to reducing porosity in electroless copper deposition.

BACKGROUND

Electroless plating, also known as chemical or auto-catalytic plating, is a non-galvanic type of metal deposition that involves several simultaneous reactions in an aqueous solution, which may occur without the use of external electrical power. The reaction is accomplished when hydrogen is released by a reducing agent, such as sodium borohydride, and is oxidized thus producing a negative charge on the surface of the part. The most common electroless plating metals are nickel and copper, where the chemistry for each may vary.

The chemical reaction following the deposition of electroless copper indicates that approximately 22.4 liters of hydrogen may be released for every 63.5 grams of copper deposited. According to one estimate, about 350 cc of hydrogen is released for the deposition of 1 gm of electroless copper. The following equation further elaborates the chemical reaction:

$$Cu^{+2} + 2HCHO + 4OH^- \rightarrow Cu^0 + 2HCOO^- + H_2 \qquad (1)$$

The hydrogen release creates porosity in the copper. If further copper is added on top of a layer produced by electroless copper deposition, for example, via electroplating, the added copper has a tendency to retain porosity from the lower layer. From a practical manufacturing perspective, the porosity appears in the final conductive lines and affects circuitization, especially very fine line circuitry. The porosity reduces adhesion of the added copper as the metal layers may easily peel off, and is detrimental to electrical performance of the final circuit.

The hydrogen released due to the chemical reactions, occurring during the deposition of electroless copper, may also be absorbed by substrates such as polyimid, polyester, epoxy boards, and any other substrates. The absorbed hydrogen is very slowly released from the substrate and the trapped hydrogen may influence the mechanical and electrical properties of the deposited copper layer.

OVERVIEW

An apparatus, system, and method of conductive pattern formation are provided. In one embodiment, a method for reducing porosity of metal layers on a substrate may comprise depositing a precursor onto at least a portion of the substrate, and adding metal layers over the precursor comprising at least one cycle, wherein each cycle comprises: depositing a metal layer over the precursor, and exposing the metal layer to a breath-out solution.

In another embodiment, a method for reducing porosity of a metal layer on a substrate may comprise adding at least one metal layer on at least a portion of substrate via electroless deposition, exposing the at least one metal layer to a reducing agent solution, and repeating the a) adding and b) exposing until a desired metal layer thickness is achieved.

In yet another embodiment, a method for reducing porosity of metal layers on a substrate may comprise depositing an active palladium onto at least a portion of the substrate, and adding metal layers over the precursor comprising at least one cycle, wherein each cycle comprises: depositing a metal layer over the precursor, and exposing the metal layer to a solution of water and formaldehyde.

The present invention provides other hardware configured to perform the methods of the invention, as well as software stored in a machine-readable medium (e.g., a tangible storage medium) to control devices to perform these methods. These and other features will be presented in more detail in the following detailed description of the invention and the associated figures.

BRIEF DESCRIPTION OF THE DRAWINGS

The accompanying drawings, which are incorporated into and constitute a part of this specification, illustrate one or more example embodiments and, together with the description of example embodiments, serve to explain the principles and implementations.

In the drawings.

DESCRIPTION OF EXAMPLE EMBODIMENTS

Embodiments are described herein in the context of a reduced porosity copper deposition. The following detailed description is illustrative only and is not intended to be in any way limiting. Other embodiments will readily suggest themselves to such skilled persons having the benefit of this disclosure. Reference will now be made in detail to implementations as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The described components, process steps, and/or data structures may be implemented using various types of operating systems, computing platforms, computer programs, and/or general purpose machines. In addition, devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1A:
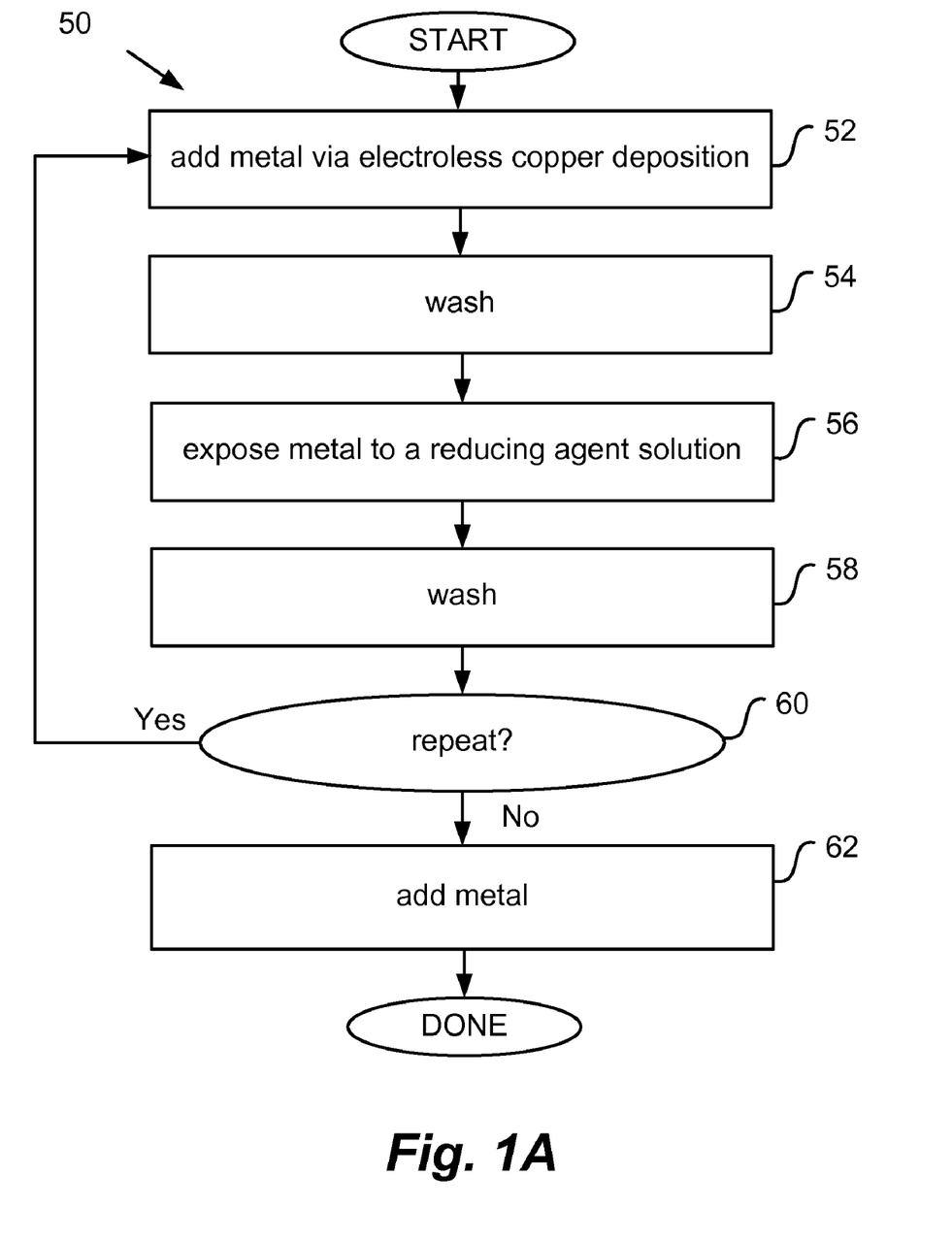
FIGS. 1A and 1B illustrate a flow diagram of a sample method to reduce porosity of metal layers produced by electroless deposition in accordance with one embodiment of the invention.
Figure 1B:
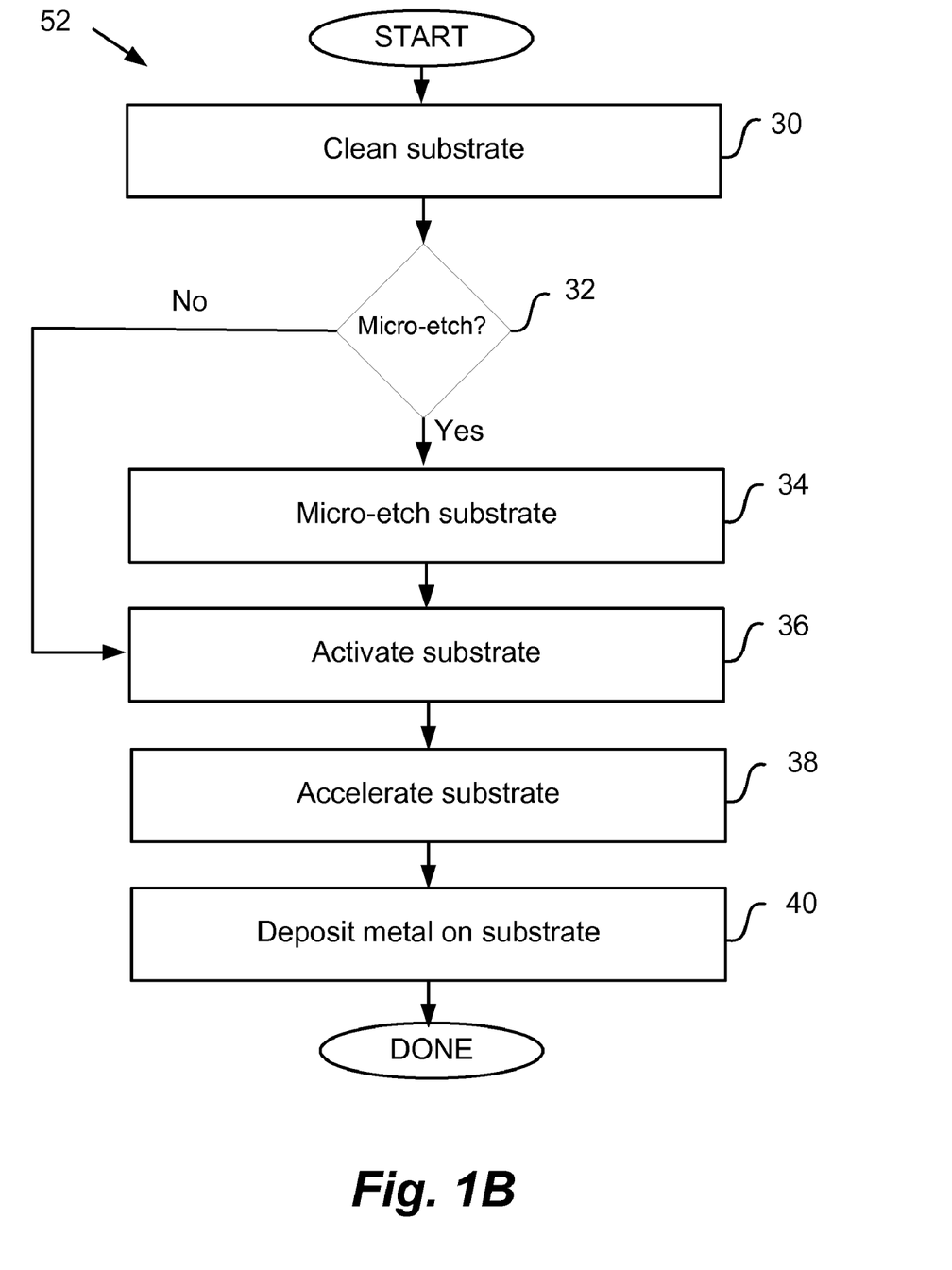

FIGS. 1A and 1B illustrate a flow diagram of a sample method to reduce porosity of metal layers produced by electroless deposition in accordance with one embodiment. Method 50 first adds a metal via a partial or full electroless deposition (52). Partial electroless copper deposition implies that multiple stages of electroless copper deposition will be used (for example, repeat 52-58). Full electroless deposition implies that a single stage of electroless copper deposition is used. In some cases, a precursor may be first added to the substrate to facilitate electroless metal deposition; this precursor usage is further described with respect to FIG. 3.

In one embodiment, electroless copper deposition includes submersing a circuit precursor in a solution. The circuit precursor includes a substrate and a precursor added to the substrate to facilitate subsequent metal deposition on the substrate. The solution may include copper ions, a reducing agent, a buffer to maintain a certain pH, and a complexing agent. Suitable reducing agents may be formaldehyde, dimethyl aminoborane, hydrazine or its salts, and the like. Suitable buffers may be ethylenediaminetetraacetic acid (EDTA), ethanolamine, and the like. Suitable complexing agents may be EDTA, sodium postassium tartrate, and the like. Other reducing agents, buffers and complexing agents may be used. The circuit precursor may be submersed for a duration that is between about 1 minute and about 30 minutes. The metal may be added (52) via any commercially available electroless deposition chemistry, technique or apparatus. Metals that may be added via electroless plating include gold, silver, copper, nickel, rhodium, and palladium, for example. Other metals may also be used. The exact chemistry and steps will vary with the type of metal.

For description purposes only and not intended to be limiting, one suitable electroless copper process may consist of four stages as illustrated in FIG. 1B: cleaning, activation, acceleration, and deposition. The substrate may be cleaned (30). The cleaning uses a cleaner-conditioner to remove organics and condition pattern features for the subsequent uptake of a catalyst. The cleaner-conditioners may be any surfactant or alkaline solution, such as sodium hydroxide, Calsoft®, and the like. Other cleaner-conditioners may also be used.

An optional micro etch (32) may follow the cleaning. The micro etch processing (34) may be any known micro etch processing that may be used in an electroless line, oxide line, pattern plate line, or with chemical cleaning. The micro etch process can remove any oxide layers on metal layer substrates to further enable electroless deposition.

Activation (36), through use of a catalyst, may reduce the positive ion metal being added. Common activation catalysts include tin chloride, palladium chloride, or any other similar catalysis. Acceleration (38) removes the remaining positive metal ions from the substrate. An example accelerator that may be used is fluoboric acid or the like. However, other accelerants may also be used. Deposition (40) of metal on the substrate can then be conducted.

Returning back to FIG. 1A, electroless copper deposition may include heavy deposition baths (designed to produce 75 to 125 micro-inches of copper) and light deposition baths (2 to 40 micro-inches). Electrolytic copper plating (62) commonly follows light deposition. Heavy deposition can survive the outer layer imaging process, with copper electroplating occurring thereafter. Common constituents of electroless copper chemistry are sodium hydroxide, formaldehyde, ethylenediaminetetraacetic acid (EDTA) or any other chelater, and a copper salt.

In one exemplary complex reaction, catalyzed by palladium, formaldehyde reduces the copper ion to metallic copper. Formaldehyde (which is oxidized), sodium hydroxide (which is broken down), and copper (which is deposited) are replenished frequently. Many heavy deposition baths have automatic replenishment schemes based on in-tank colorimeters or other analytical aids. Light deposition formulations may be controlled by analysis. An anti-tarnish bath may also be used after deposition.

The substrate and metal layer are then washed with water after the electroless copper deposition (54). The wash may remove any undesired reagents.

The deposited metal may then be submerged in a solution with a reducing agent (56), Dipping the deposited metal in the solution allows for the release of gasses produced in the metal from the electroless copper formulation (52), without the addition of additional copper layers. This process thus helps diffuse any gasses, such as hydrogen, trapped in the metal layer, such as a copper layer. As mentioned before, reducing porosity in the metal improves the adhesion and ductility and the formation of circuitry.

The reducing agent solution may vary. In one embodiment, the reducing agent solution has a pH of between about 5 and about 8. In a specific embodiment, the reducing agent solution has a pH of between about 6 and about 7. In one example, the reducing agent solution has a pH of between about 6.5 and about 7.5.

Submersion times will vary with the materials, reducing agent solution and desired product quality. In one embodiment, the substrate and electroless copper layer are submerged in a 10% formaldehyde solution of water for between about 10 seconds to 10 minutes. In a specific example, the substrate and electroless copper are submerged for between about 1 minute to 3 minutes. While there is no electroless copper deposition occurring in the reducing agent solution dip (56) the trapped gasses in the metal may breath out or diffuse out of the metal layer.

Other solutions, reducing agents, and durations may be used. For example, other suitable reducing agents that may be used are hydrazine hydrochloride, other aldehydes (other than formaldehyde) such as paraformaldehyde, glyoxylic acid, acetaldehyde, isopropyl alcohol, benzaldehyde, cinnamaldehyde, and the like. In some cases it is beneficial to add a phase transfer catalyst or a surfactant to facilitate the transfer of the aldehydes to the substrate surface. The reducing agent may also vary with the type of metal used in the electroless copper deposition, chemicals used in the electroless copper deposition, and other factors. The dip in the reducing agent is a "breath-out" or diffusion phase in the electroless deposition wherein the trapped or adsorbed hydrogen or any other gases are released from the substrate without copper deposition.

The exposure to the reducing agent permits an overall thicker copper deposit to be formed on the substrate with reduced porosity and hence increased adhesion. In one testing example of copper on polyimide "E" and a formaldehyde solution, layers in the order of 5-7 micro inches were produced subsequent to treatment of the polyimide "E" with a catalyst. On the other hand, deposits obtained using a single dip in the electroless copper baths—and without submerging the deposited metal in a reducing agent solution—did not exceed 3 micro inches following the same catalytic treatment.

The substrate and metal layer are washed with water again after the being exposed in a reducing agent solution (58). The wash may remove any undesired reagents, such as the reducing agent.

Should additional metal layers be added via electroless deposition (60), the process may repeat at 52. For example, in one multi-pass electroless copper deposition, the process may be repeated from 52-58 to attain a desired thickness of a seed layer for subsequent electroplating. Indeed, submerging the deposited metal layers in the reducing agent solution (56) allows for the continuous release of gases without the deposition of additional metal layers and permits the process to be repeated from 52-58 as often as necessary with highly reduced porosity.

In one embodiment, vibratory agitation may be used during the dips in the electroless copper bath and the reducing agent solution (52 and 56). The vibratory agitation helps dislodge the micro bubbles of trapped gasses, and releases the gasses more efficiently. During the dip in the reducing agent, the vibratory and/or ultrasonic agitation accelerates the removal of trapped and/or adsorbed hydrogen, or any other gases, from the substrate. In a specific embodiment, vibratory agitation is obtained by attaching a commercial "massager" to the substrate, plating, and/or dipping bath. Thus, the bath and/or the substrate may be agitated to facilitate the removal of the trapped gasses. In another embodiment, the vibratory agitation includes ultrasonic agitation whereby sonic energy at the frequency range of 10-100 kilohertz (kHz) is applied to the bath and/or substrate.

If no more electroless deposition is needed ('No' in decision 60), and extra metal is desired, then another metal deposition technique may be used to deposit further metal (62). The metal deposition technique may be the same as in step 52 or may be a different metal deposition chemistry. In one embodiment, the electroless copper then acts as a seed layer that enables copper to be electroplated on top of the electroless copper to get a desired thickness for the conductive lines.

Electroplating deposits additional metal for the conductive lines. Electroplating supplies metal in its ionic form with electrons to form a non-ionic coating on a substrate. One common electroplating system involves a chemical solution that contains the ionic form of the metal, an anode (positively charged) which may consist of the metal being plated (a soluble anode) or an insoluble anode (usually carbon, platinum, titanium, lead, and the like), and finally, a cathode (negatively charged) where electrons are supplied to produce a film of non-ionic metal. Electroplating may not be necessary when enough copper or metal has been deposited by the electroless deposition process (50), but may be used after a light deposition. Electroplating may include a full panel plating, which adds about 1 millimeter (mil) on the surface, or a "flash" panel plating, designed only to add small amounts of copper. Flash-plated panels return to copper electroplating to be plated up to a required thickness.

Figure 2:
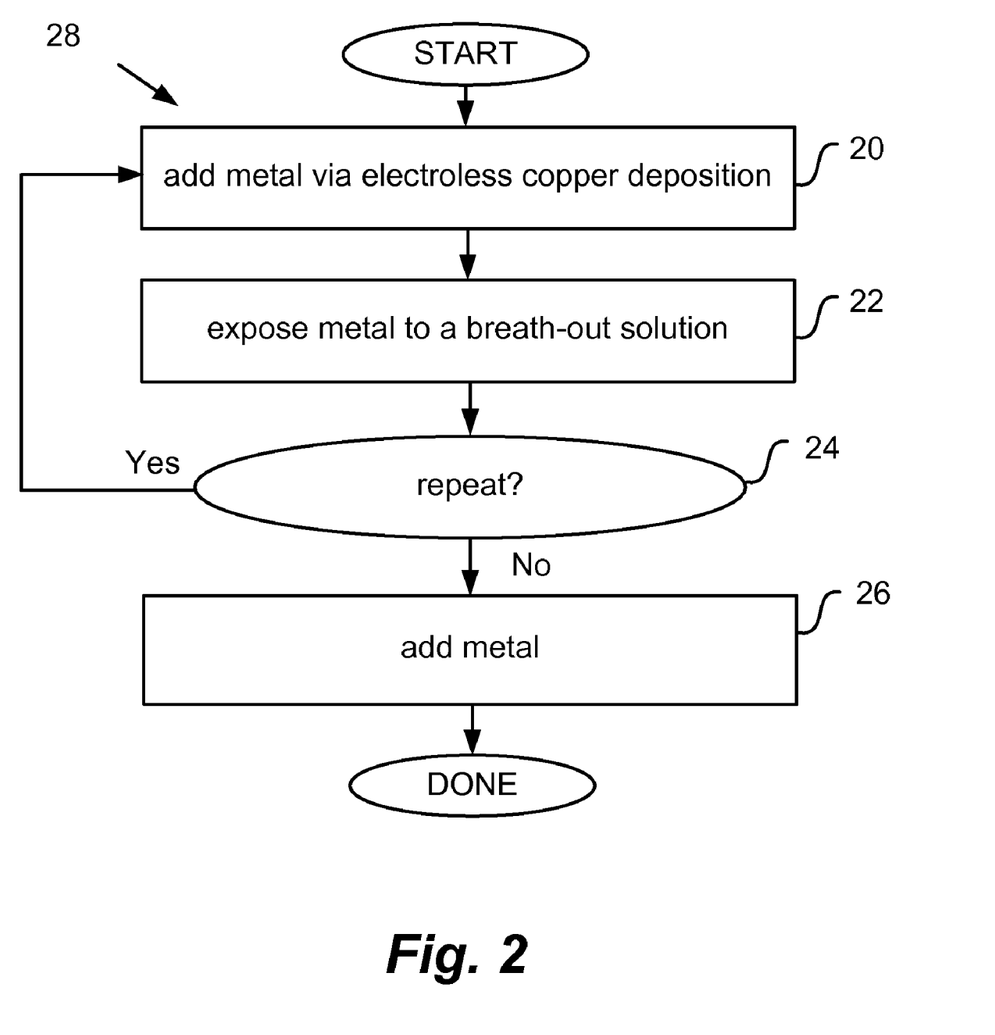
FIG. 2 illustrates a flow diagram of a sample method to reduce porosity of metal layers produced by electroless deposition in accordance with another embodiment of the invention.

FIG. 2 illustrates a flow diagram of a method to reduce porosity of metal layers produced by electroless deposition in accordance with another specific embodiment. Method 28 first adds metal via a partial or full electroless deposition (20) similar to 52 in FIG. 1A. In one embodiment, electroless copper deposition includes submersing a circuit precursor in a solution that includes copper ions, a reducing agent, a buffer to maintain a certain pH, and a complexing agent. The circuit precursor may be submersed for between about 1 minute to about 30 minutes. The metal may be added (20) via any commercially available electroless deposition chemistry, technique or apparatus. Metals that may be added via electroless plating include gold, silver, copper, nickel, rhodium, and palladium, for example. The exact chemistry and steps will vary with the type of metal.

For exemplary purposes only and not intended to be limiting, the suitable electroless copper process may be similar to the process described and illustrated above with reference to FIG. 1B: cleaning, activation, acceleration, and deposition.

The substrate and metal layer may then be exposed to a breath-out solution (22) after the electroless copper deposition. The breath-out solution may be any polar, water soluble solvent that does not react with the metal and/or does not oxidize the metal. Rather, the breath-out solution facilitates the release of gasses produced in the electroless copper formulation (52) that are in the metal as well as remove any undesired reagents. Exemplary breath-out solutions may be water, water and an organic solvent, water de-aerated with a gas such as nitrogen, argon, helium, carbon dioxide, or any other solution that does not react or oxidize the metal. Other water soluble breath-out solutions may be used.

This breath-out process thus helps diffuse any gasses, such as hydrogen, trapped in the metal layer, such as a copper layer. The breath-out solution exposure permits an overall thicker copper deposit to be formed on the substrate by controlling the porosity of copper and its subsequent de-lamination due to excessive out gassing of hydrogen during the electroless copper deposition process. Furthermore, this process reduces porosity and increases adhesion of copper on the substrate.

The breath-out solution may have a pH of between about 5 and about 9. In one embodiment, the breath-out solution may have a pH of between about 6 and about 8. In another example, the breath-out solution may have a pH of between about 6.5 and about 7.5.

When using an aqueous breath-out solution, such as with water, the substrate and metal layers need not be put through a wash bath (54 and 58 of FIG. 1A). If other solvents are used, the reagents must be removed using a water wash bath (54 and 58 of FIG. 1A) to prevent contamination. Thus, the use of an aqueous breath-out solution saves time, costs, and reduces waste materials.

The substrate and metal layer may be submerged in the breath-out solution for between about 10 seconds to about 10 minutes. In a specific example, the substrate and electroless copper are submerged for between about 10 seconds to about 1 minute. While there is no electroless copper deposition occurring in the breath-out solution dip (22), the trapped gasses in the metal breathe or diffuse out of the metal layer.

In one embodiment, vibratory agitation may be used during the dips in the electroless copper bath and the breath-out solution (20 and 22). The vibratory agitation helps dislodge the micro bubbles of trapped gasses, and releases the gasses more efficiently. As stated above, reducing porosity in the metal may improve adhesion ductility, formation of circuitry, and electrical properties of the metal.

Should additional metal layers be added via electroless deposition (24), the cycle or process may repeat at 20. For example, in one multi-pass electroless copper deposition, the process may be repeated from 20-22 to attain a desired thickness of a seed layer for subsequent electroplating. Indeed, submerging the deposited metal layers in the breath-out solution (22) permits the cycle to be repeated from 20-22 as often as necessary with highly reduced porosity.

If no more electroless deposition is needed ('No' in decision 24), and extra metal is desired, then another metal deposition technique may be used to deposit further metal (26). In one embodiment, the electroless copper then acts as a seed layer that enables copper to be electroplated on top of the electroless copper to get a desired thickness for the conductive lines. Electroplating, as described above with reference to FIG. 1A, may be used to add the extra metal.

Figure 3:
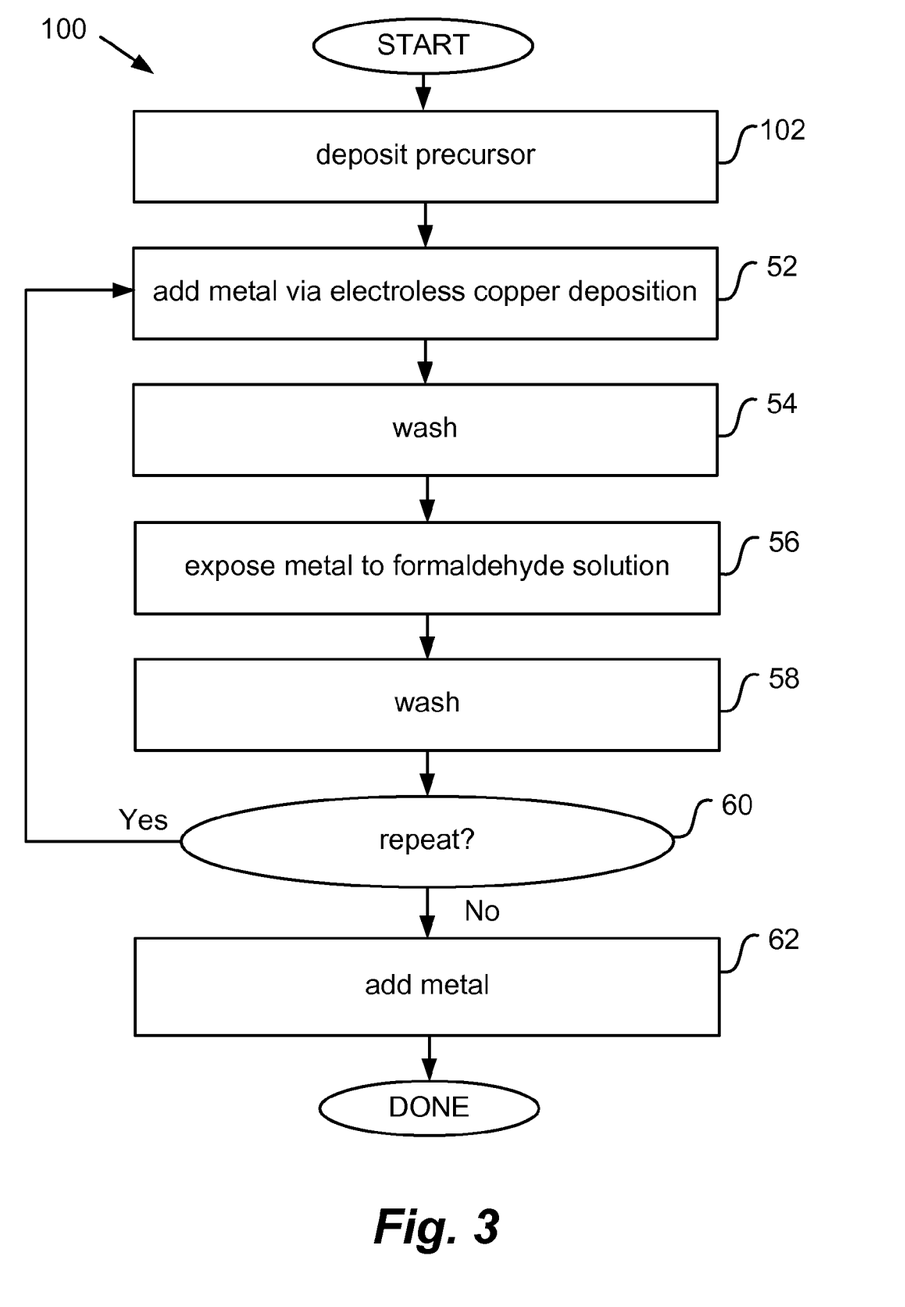
FIG. 3 illustrates a flow diagram of a sample method to reduce porosity of metal layers produced by electroless deposition in accordance with yet another embodiment of the invention.

FIG. 3 illustrates a flow diagram of a method to reduce porosity of metal layers produced by electroless deposition in accordance with another embodiment of the invention. Method 100 begins by depositing a precursor onto a substrate (102). In one embodiment, the precursor includes elemental and active palladium. The active and elemental palladium may be added onto the surface of a substrate before the copper electroless deposition. Active palladium is a metal precursor that works well with many substrates and electroless copper deposition techniques. The active palladium has two desirable properties: (1) it is catalytic for subsequent addition of a metal onto the palladium (such as electroless deposition), and (2) it is strongly anchored to the underlying substrate beneath and the electrolessly deposited metal over it. The active palladium is disposed in minute amounts on the surface and does not form a conductive layer by itself, but facilitates subsequent deposition of a metal onto the surface, according to the pattern of the palladium, to form a conductive pattern. The conductive pattern may include one or more conductive lines, or a block deposition of metal according to other shapes that do not resemble lines.

This conductive pattern formation is well suited for use in circuit manufacture, and finds wide use to create both existing and new products. For example, the present invention enables and eases printing of conductive lines onto flexible substrates and substrates with custom shapes.

In one embodiment, the active palladium approximately has a zero valance. The active palladium may also be disposed monoatomically onto the substrate. Elemental palladium does not readily bind to a surface monoatomically or with an approximately zero valance, and needs to be deliberately processed to achieve such a state.

The precursor may be deposited as a solution. The precursor, or a precursor solution, may be delivered to a substrate in any of a number of different manners. In one embodiment, the precursor is blank deposited, without a pattern onto the substrate to form the precursor. In another embodiment, the precursor solution is delivered only to selective regions of the substrate according to a desired pattern. This spatial selectivity is referred to herein as "printing" the palladium precursor solution on the substrate. In other embodiments, the palladium precursor solution coats the entire substrate or a large portion thereof. This may be accomplished via a printer (where the entire surface is selected for printing), dip coating, or another blank printing procedure. In such cases, the blank palladium precursor solution may or may not be subsequently patterned to produce the pattern. When dispersed by a printer or automated printing process, the palladium precursor solution may be considered, and referred to herein, as an 'ink' or a 'palladium ink'.

Precursor printing may use a commercially available printing technique or apparatus. In other cases, a printing apparatus is specially manufactured and/or configured for printing a precursor solution. The printing apparatus may include a contact or contact-less printing technology, and/or signal-directed, manual or mechanical means. For example, the printing apparatus may employ any one, or a combination, of the following printing technologies: ink-jet printing, screen printing, pad-printing, spray coating, spin coating, puddle coating, dip coating, Gravure printing, ultrasonic spray techniques, wire coating, a stencil, rotogravure, flexographic techniques, brush coating, or various other blank coating techniques. Monochrome printing is suitable in many instances.

Various processes and printing apparatus for blanket depositing of precursor may also be employed. A blanket deposition involves coating a large portion or the entire substrate surface with the palladium ink and without defining a pattern. Dip coating represents one suitable method for blanket deposition of palladium ink. Dip coating allows substrates in any shape and size to have palladium precursor solution disposed thereon. For example, strands and fibers such as those later weaved together may be dip coated, in addition to non-flat surfaces.

In one embodiment, the printing apparatus permits conformal printing of the precursor. Conformal printing refers to printing precursor on non-flat and three-dimensional surfaces. For example, the non-flat surface may include the inner surface of a cell phone housing or other portable electronics device, which is commonly curved and custom shaped. In one embodiment, conformal printing apparatus includes a pen, movable in three dimensions, that dispenses palladium ink in response to a control signal. Based on a known position of the controlled pen relative to the non-flat substrate, ink is released at controlled times and a pattern is then produced on the conformal surface as desired.

In one embodiment, the precursor is disposed on the surface by depositing a palladium precursor solution onto the substrate. A solvent in the solution is then evaporated away, before decomposing a palladium precursor (left after the evaporation) to produce active palladium on the substrate surface.

The solvent evaporation and decomposition typically add energy. Generally, this may use any combination of heat, an e-beam, an ion beam, a laser, ultra-violet rays, infra-red rays, or the like. The palladium precursor solution is exposed to conditions that promote evaporation of the solvent from the palladium precursor solution, to leave a palladium precursor on the substrate. This may include supplying heat to the substrate and/or solution via conduction, convection and/or radiation. A field evaporation using convection is suitable for many applications. In one embodiment, an evaporation apparatus receives the substrate and exposes the palladium precursor solution to conditions that promote evaporation of the solvent from the palladium precursor solution to leave the precursor on the substrate. In another embodiment, solvent evaporation is coupled with the decomposition process. In this case, evaporation apparatus is part of a larger apparatus that also performs decomposition of the palladium precursor. Spatial control for the decomposition is useful when a pattern has not already been established, for example, during blank deposition of the solution onto the substrate. In a specific embodiment, a guided laser, ion beam or e-beam, is employed to provide a pattern on the surface by locally decomposing the palladium precursor according to the beam movement.

Further description of active palladium suitable for use herein is provided in co-pending patent application Ser. No. 11/520,341, filed on Sep. 12, 2006, which is entitled 'FLEXIBLE CIRCUIT CHEMISTRY' and incorporated by reference in its entirety for all purposes. This patent application also describes suitable deposition and manufacturing techniques that are suitable for use herein.

Returning back to FIG. 3, method 100 proceeds as described above with respect to method 50 in FIG. 1A, except that the patterns of precursor on the substrate determine where subsequent metal deposition occurs. Furthermore, the substrate and metal may be washed (54 and 58) using the breath-out solution discussed above with reference to FIG. 2 such that the exposure to formaldehyde solution (56) may not be necessary. Output of method 100 is a substrate with copper disposed over the active palladium according to the palladium pattern.

Methods 50, 28, and 100 provides for a substrate with copper disposed over the substrate, with or without a pattern, and with less porosity than conventional metal deposition techniques. A pattern refers to one or more surface areas on a substrate in which conductive materials occupy after the electroless deposition process is finished. As described above with reference to FIG. 3, the pattern may be established using a precursor. Often, the pattern resembles a set of conductive lines in a circuit. Other patterns also include circles, rectangles, sets of concentric circles or rectangles used for an antenna, and the like. In general, any pattern may be used.

Any type of substrate may be used. The choice of substrate is typically driven by a particular application. At a high level, the substrate may be conductive, semi conductive, or insulating. Thus, the dielectric constant of the material may be of any value. The substrate may be homogeneous or heterogeneous in terms of the material it is made from. As an example of a heterogeneous substrate, packaging for a semiconductor chip includes a dielectric substrate on which conductive vias are formed. Line traces defined by a palladium ink pattern, as further described below, may be patterned to connect one conductive via to another or a conductive via to an external lead or pin.

The substrate can be flat or topologically varying. An example of a non-flat substrate is the inner casing of a cell phone that has a convex and custom shape. Additionally, the substrate may be rigid, flexible or semi rigid. There are multiple ways to characterize a flexible substrate, including elastic modulus and/or thickness. In one embodiment, a flexible substrate includes an elastic modulus less than about 1 Giga Pascal (GPa). In a more specific embodiment, a flexible substrate includes an elastic modulus less than about 100 Mega Pascal (MPa). In one embodiment, a flexible substrate includes a thickness less than about 1 centimeter. In a more specific embodiment, the thickness is less, about 1 mil. A higher modulus of elasticity and/or thickness may also be used.

One substrate of particular interest is polyimid. Polyimid (also sold as Kapton®) is commercially available in thin sheets, and is suitable for circuit applications that include a flexible substrate. Other exemplary substrates may include polyester, polypropylene, polyethylene, ceramic materials, or any other good dielectric material. The substrate can also be a metallic material. Furthermore, the substrate can be plastic, ceramic, glass, silicon wafer, cellulose, graphite, paper substrates, and the like. Paper readily permits printing using commercially available and general-purpose printers. In general, substrate selection is driven by an application. Many rigid circuit board applications use silicon wafers and Fr-2 or Fr-4 substrates, and are suitable for use herein.

The examples described herein are for exemplary purposes only and is not intended to be limiting any other solutions, times, temperatures, and the like may be used.

Example 1

A polyimide substrate, measuring 7.5"×7.5" was washed with isopropyl alcohol (IPA) and dipped in amyl acetate containing about 180 parts per million (ppm) palladium. The substrate was heated in air at about 260 degrees Celsius for about 5 minutes. Then it was dipped in electroless copper solution (using McDermid electroless copper chemistry technique) for about 2 minutes followed by washing with water and a dip in a solution of about 10% formaldehyde in water for approximately 1 minute. The substrate was washed with water and dipped in electroless copper solution for about 1 minute and 20 seconds. The substrate was washed with water and dried. The thickness of the electroless copper layer was determined to be approximately 5 micro inches. On this substrate, about 29.5 microns of copper was further deposited by electroplating in an acid copper plating bath.

Example 2

A polyimide substrate, measuring 8"×7" was washed with isopropyl alcohol (IPA) and dipped in amyl acetate containing about 130 parts per million (ppm) palladium. The substrate was dried and then heated at about 330 degrees Celsius in air for about 10 minutes and washed with de-ionized (DI) water. Then it was dipped in electroless copper solution (using McDermid electroless copper chemistry technique), constantly stirred and agitated with an Impac massager for 145 seconds. It was then dipped in DI water for about 3 minutes at ambient temperature with constant agitation with the Impac massager. The substrate was then dipped in the same electroless copper solution, again with constant stiffing and agitation with the Impac massager. The substrate was washed with water and dried. The average thickness of the electroless copper layer was determined to be approximately 5.32 micro inches. On this substrate, about 40 microns of copper was deposited by electroplating in an acid copper plating bath.

While embodiments and applications of this invention have been shown and described, it would be apparent to those skilled in the art having the benefit of this disclosure that many more modifications than mentioned above are possible without departing from the inventive concepts herein.

What is claimed is:

1. A method for reducing porosity of metal layers on a substrate, comprising:
   depositing a circuit precursor onto at least a portion of the substrate, wherein the circuit precursor is monatomically disposed on the substrate in the form of single isolated atoms; and
   adding metal layers via electroless deposition over the precursor comprising at least two cycles, wherein each cycle comprises:
      depositing a metal layer via electroless deposition over the precursor; and
      subsequently exposing the metal layer to a breath-out solution that facilitates the release of gases trapped in the deposited metal layer.

2. The method of claim 1, wherein the precursor is active palladium.

3. The method of claim 1, wherein the exposing further comprises inserting the substrate into a reducing agent solution.

4. The method of claim 3, further comprising ultrasonically agitating the breath-out solution.

5. The method of claim 3, further comprising agitating the substrate while inserted in the breath-out solution.

6. The method of claim 1, wherein the breath-out solution comprises water.

7. The method of claim 6, wherein the breath-out solution further comprises formaldehyde.

8. The method of claim 1, wherein the exposing takes between about 10 seconds to about 10 minutes.

9. The method of claim 1, wherein the exposing takes between about 10 seconds to about 1 minute.

10. The method of claim 1, further comprising washing the metal layer in a water bath prior to and after the exposing.

11. The method of claim 1, wherein the depositing further comprises an electroless copper deposition.

12. The method of claim 1, wherein the breath-out solution has a pH of between about 5.5 to about 8.

13. The method of claim 1, wherein the depositing a metal layer further comprises depositing a different metal deposition chemistry after the exposing.

14. A method for reducing porosity of metal layers on a substrate, comprising:
depositing an active palladium circuit precursor onto at least a portion of the substrate, wherein the active palladium circuit precursor is monatomically disposed on the substrate in the form of single isolated atoms; and
adding metal layers via electroless deposition over the active palladium circuit precursor comprising at least two cycles, wherein each cycle comprises:
depositing a metal layer via electroless deposition over the active palladium circuit precursor; and
exposing the metal layer to a solution of water and formaldehyde.

15. The method of claim 14, wherein the exposing further comprises inserting the substrate into the solution.

16. The method of claim 15, further comprising ultrasonically agitating the solution.

17. The method of claim 15, further comprising agitating the substrate while inserted in the solution.

18. The method of claim 14, wherein the exposing takes between about 10 seconds to about 10 minutes.

19. The method of claim 14, wherein the exposing takes between about 10 seconds to about 1 minute.

20. The method of claim 14, further comprising washing the metal layer in a water bath prior to and after the exposing.

21. The method of claim 14, wherein the reducing agent solution has a pH of between about 5 to about 9.

* * * * *